United States Patent
Zimmer

(10) Patent No.: US 9,958,511 B2
(45) Date of Patent: May 1, 2018

(54) SOFT SWITCHING OF MAGNETIZATION IN A MAGNETORESISTIVE SENSOR

(71) Applicant: Infineon Technologies AG, Neubiberg (DE)

(72) Inventor: Jürgen Zimmer, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 354 days.

(21) Appl. No.: 14/563,042

(22) Filed: Dec. 8, 2014

(65) Prior Publication Data

US 2016/0161574 A1   Jun. 9, 2016

(51) Int. Cl.
G01R 33/09 (2006.01)

(52) U.S. Cl.
CPC ......... *G01R 33/093* (2013.01); *G01R 33/096* (2013.01); *G01R 33/098* (2013.01)

(58) Field of Classification Search
CPC ... G01R 33/093; G01R 33/096; G01R 33/098
See application file for complete search history.

(56) References Cited

U.S. PATENT DOCUMENTS

| | | | |
|---|---|---|---|
| 5,847,904 A | 12/1998 | Bharthulwar | |
| 6,165,607 A | 12/2000 | Yamanobe et al. | |
| 7,848,063 B2 | 12/2010 | Koui | |
| 8,072,714 B2 | 12/2011 | Sato et al. | |
| 9,638,643 B2 | 5/2017 | De Jong et al. | |
| 2004/0037015 A1 | 2/2004 | Asatani et al. | |
| 2006/0007607 A1 | 12/2006 | Abe et al. | |
| 2007/0080683 A1 | 4/2007 | Bartos et al. | |
| 2007/0195469 A1 | 8/2007 | Takashita et al. | |

(Continued)

FOREIGN PATENT DOCUMENTS

| | | |
|---|---|---|
| CN | 1165302 | 11/1997 |
| CN | 1590580 | 3/2005 |

(Continued)

OTHER PUBLICATIONS

Wikipedia, "Magnetoresistance," http://en.wikipedia.org/wiki/Magnetoresistance, Dec. 5, 2014, 4 pages.

*Primary Examiner* — Tung X Nguyen
*Assistant Examiner* — Feba Pothen
(74) *Attorney, Agent, or Firm* — Harrity & Harrity, LLP

(57) ABSTRACT

A magnetoresistive sensor may include a stripe portion comprising magnetoresistive material. The stripe portion may have a stripe width extending along a first axis from a first stripe edge of the stripe portion to a second stripe edge of the stripe portion, a length along a second axis that is substantially perpendicular to the first axis, a first end, and a second end. The first end and the second end may be positioned at opposite ends of the stripe portion along the second axis. The magnetoresistive sensor may include an extension portion comprising magnetoresistive material. The extension portion may be positioned at the first end of the stripe portion, and may have an extension width along the first axis. The extension width may be larger than the stripe width, such that the extension portion extends beyond the first stripe edge and the second stripe edge.

17 Claims, 12 Drawing Sheets

(56) References Cited

U.S. PATENT DOCUMENTS

| | | | | |
|---|---|---|---|---|
| 2010/0271013 A1* | 10/2010 | Servel | .................... | G01D 5/145 |
| | | | | 324/207.21 |
| 2010/0327864 A1* | 12/2010 | Vigna | .................... | B82Y 25/00 |
| | | | | 324/252 |
| 2011/0063057 A1 | 3/2011 | Takahashi et al. | | |
| 2012/0098533 A1* | 4/2012 | Zimmer | ............... | G01R 33/098 |
| | | | | 324/252 |
| 2013/0099783 A1* | 4/2013 | Kubik | .................. | G01R 33/096 |
| | | | | 324/252 |

FOREIGN PATENT DOCUMENTS

| | | |
|---|---|---|
| CN | 1777816 | 5/2006 |
| CN | 101097719 | 1/2008 |
| CN | 101183704 | 5/2008 |
| CN | 201359503 | 12/2009 |
| WO | WO 2013/149961 | 10/2013 |

* cited by examiner

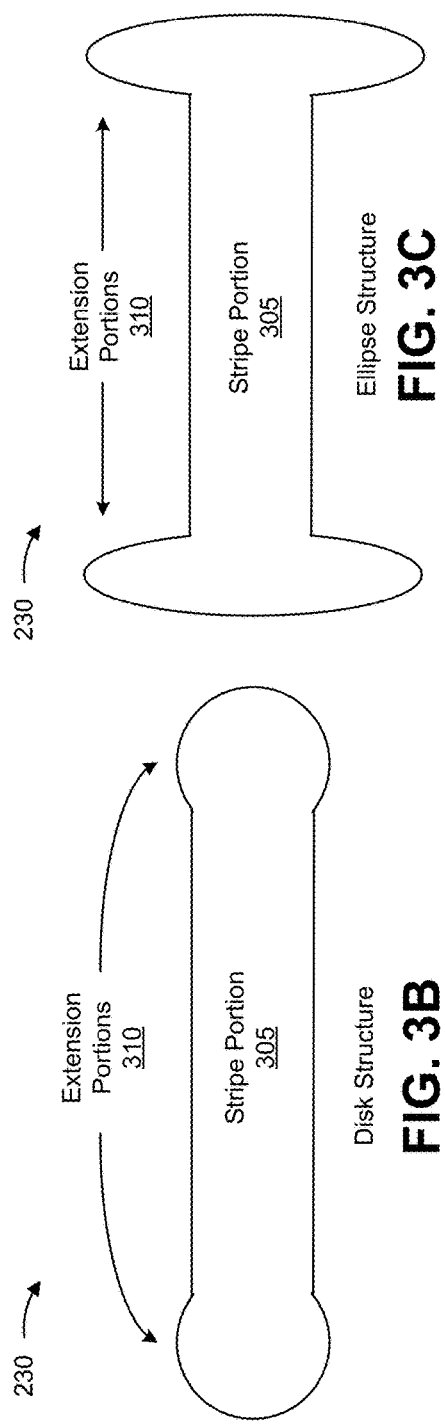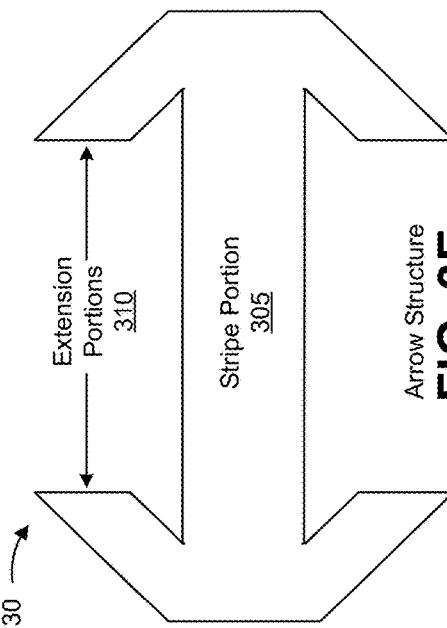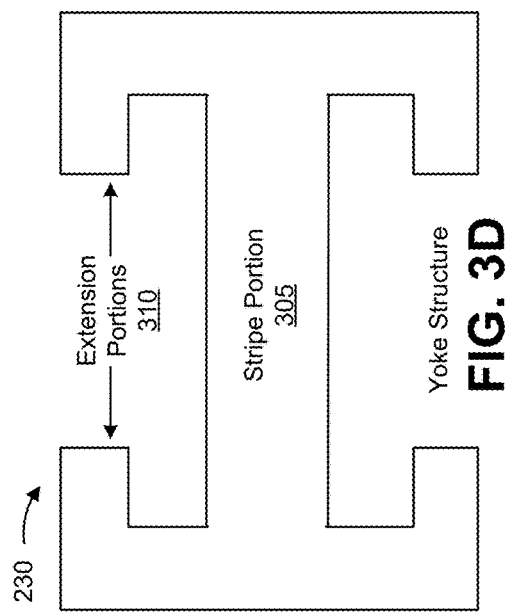

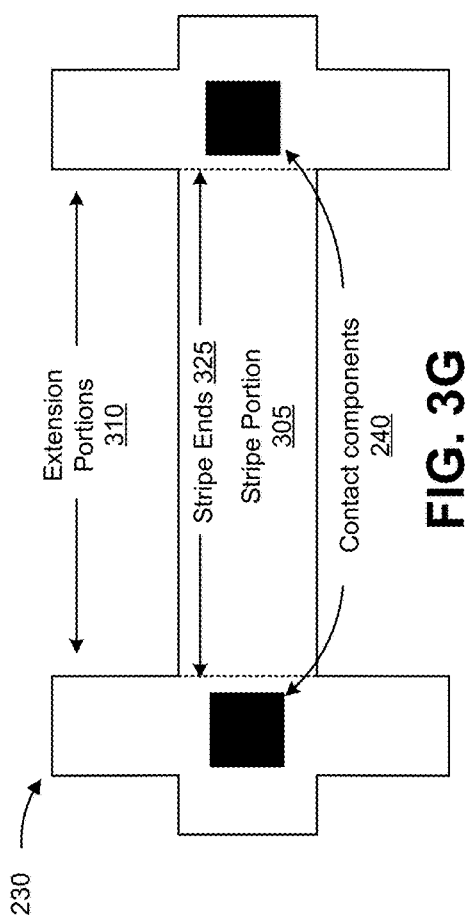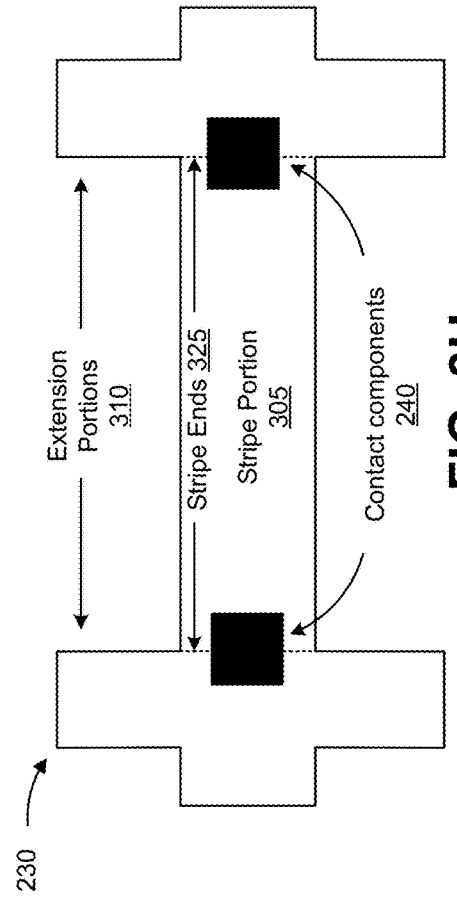

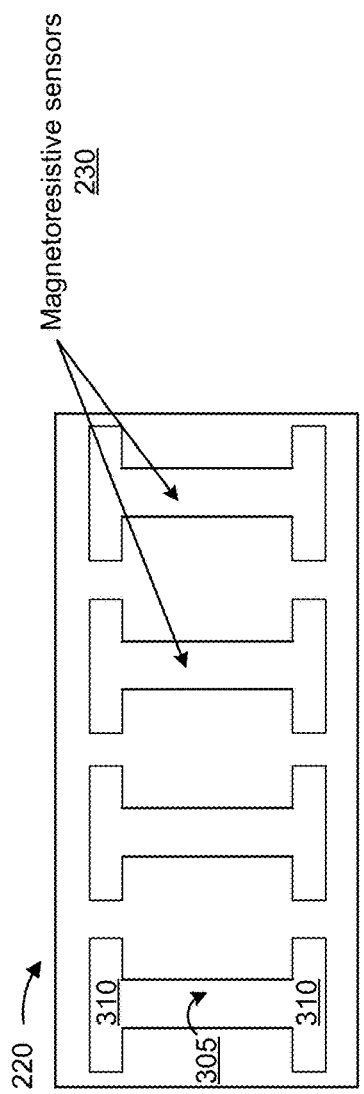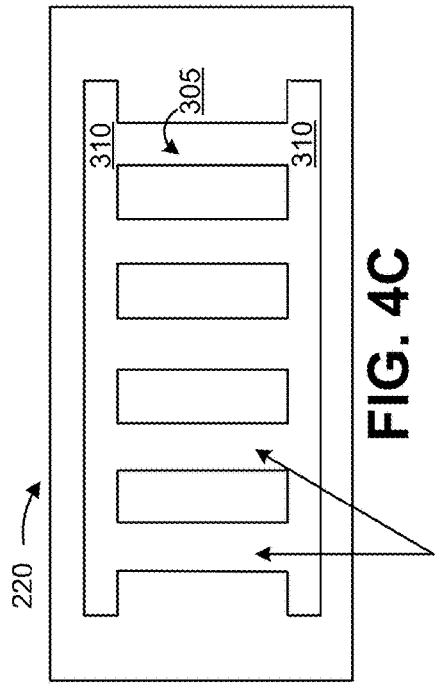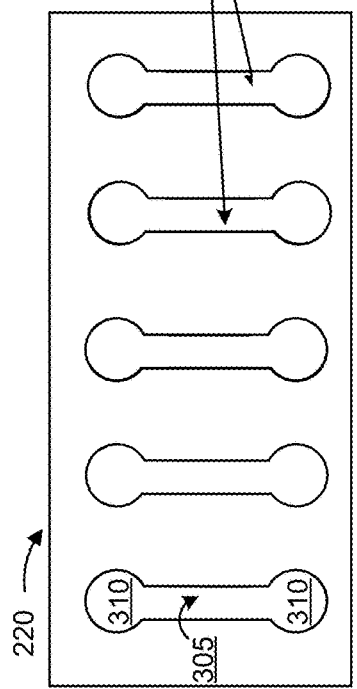

SOFT SWITCHING OF MAGNETIZATION IN A MAGNETORESISTIVE SENSOR

BACKGROUND

Magnetoresistance is a property of a material that causes the material's electrical resistance to change when an external magnetic field is applied to the material. Examples of magnetoresistance include anisotropic magnetoresistance (AMR), giant magnetoresistance (GMR), tunnel magnetoresistance (TMR), or the like.

SUMMARY

According to some possible implementations, a magnetoresistive sensor may include a stripe portion comprising a first magnetoresistive material. The stripe portion of the magnetoresistive sensor may have a stripe width along a first axis, a length along a second axis that is substantially perpendicular to the first axis, a first end, and a second end. The first end and the second end may be positioned at opposite ends of the stripe portion along the second axis. The magnetoresistive sensor may include an extension portion comprising a second magnetoresistive material. The extension portion of the magnetoresistive sensor may be positioned at the first end of the stripe portion. The extension portion may have an extension width along the first axis. The extension width may be larger than the stripe width.

According to some possible implementations, a sensor module may include a magnetoresistive sensor. The magnetoresistive sensor may include a stripe portion comprising magnetoresistive material. The stripe portion may have a first width along a first axis, a first end positioned on a second axis that is substantially perpendicular to the first axis, a second end positioned on the second axis, and a length measured from the first end to the second end. The length may be larger than the first width. The magnetoresistive sensor may include an extension portion comprising magnetoresistive material. The extension portion may be positioned at the first end of the stripe portion. The extension portion may have a second width along the first axis, and the second width may be larger than the first width.

According to some possible implementations, an apparatus to measure magnetoresistance may include a stripe portion of magnetoresistive material. The stripe portion may have a stripe width along a first axis, a stripe length along a second axis that is substantially perpendicular to the first axis, a first stripe end, and a second stripe end. The first stripe end and the second stripe end may be positioned at opposite ends of the stripe portion along the second axis. The apparatus may include a first extension portion of magnetoresistive material. The first extension portion may be positioned at the first stripe end. The first extension portion may have a width, along the first axis, that is larger than the stripe width. The apparatus may include a second extension portion of magnetoresistive material. The second extension portion may be positioned at the second stripe end. The second extension portion may have a width, along the first axis, that is larger than the stripe width.

BRIEF DESCRIPTION OF THE DRAWINGS

FIGS. 3A-3H are diagrams of example magnetoresistive sensors according to some implementations described herein;

FIGS. 4A-4C are diagrams of example sensor modules according to some implementations described herein;

DETAILED DESCRIPTION

Figure 1A:
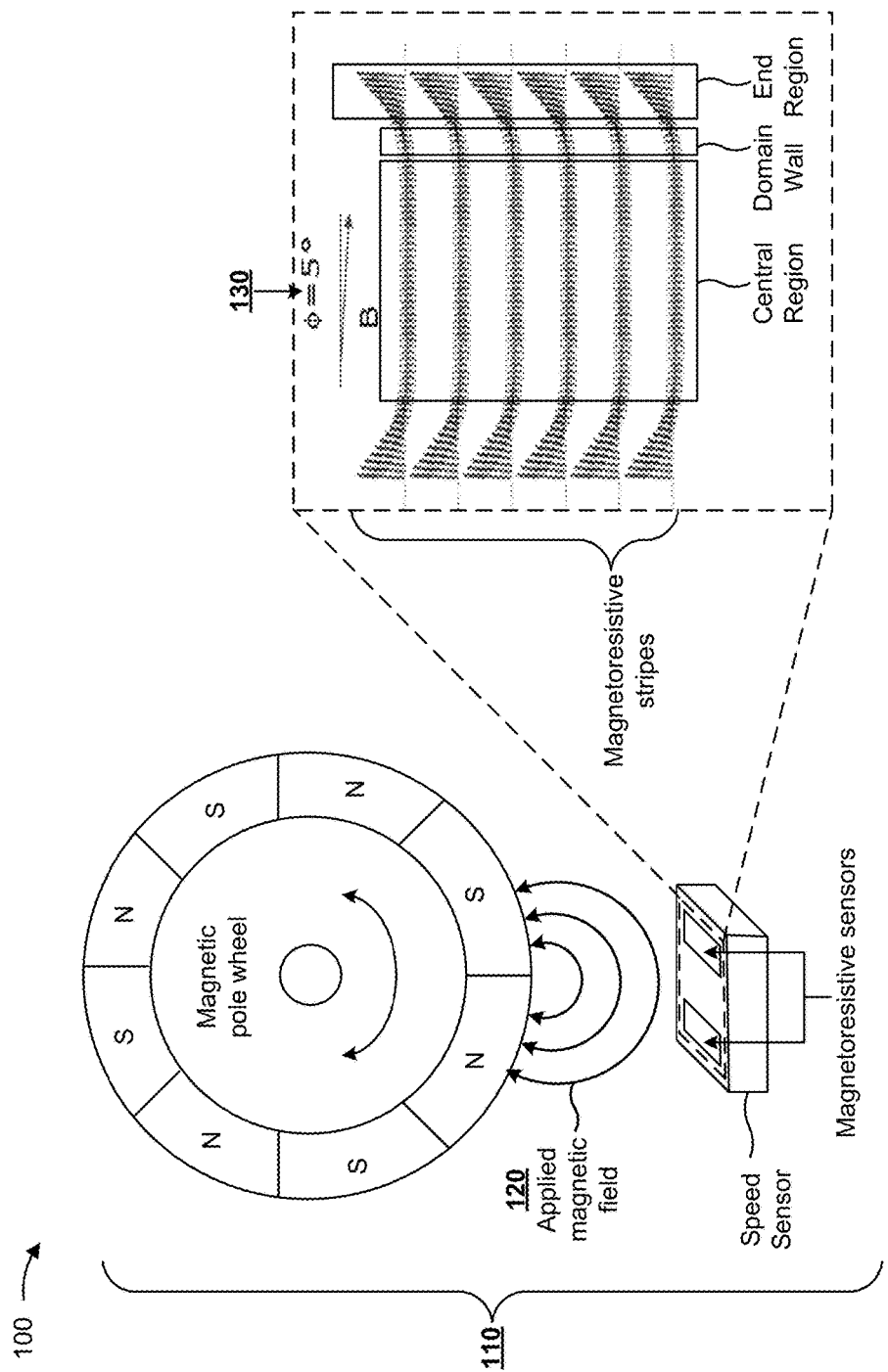
FIGS. 1A-1C are diagrams of an overview of an example implementation described herein.

The following detailed description of example implementations refers to the accompanying drawings. The same reference numbers in different drawings may identify the same or similar elements.

A magnetoresistive sensor (e.g., a sensor based on the magnetoresistance effect) may include one or more magnetoresistive sensor elements, or magnetoresistive stripes ("stripes"), made of a magnetoresistive material, such as nickel iron (NiFe), for example, but not limited thereto. The electrical resistance exhibited by the stripe may depend on a direction and/or a strength of a magnetic field applied to the stripe. Because of a relationship between electrical resistance and a direction of the magnetic field, the stripe may be used to measure the speed of a moving magnet (e.g., rotational speed, linear speed, etc.). As the magnet moves, the direction of the magnetic field applied to the stripe changes, leading to a corresponding change in electrical resistance of the stripe. By measuring the change in electrical resistance over time, the speed of the moving magnet can be determined. As an example, by attaching a magnet (e.g., a magnetic pole wheel) to an axle or a wheel, a magnetoresistive sensor, that includes a stripe, may be used to measure the rotational speed of the axle or the wheel, which may be used to measure the speed of a vehicle.

Due to a phenomenon known as shape anisotropy, the internal magnetization (e.g., the direction of the internal magnetic field) of the magnetoresistive stripe varies at different portions of the stripe. For example, magnetic moments of magnetic domains nearer to the center of the stripe may align more easily with an applied external magnetic field than magnetic moments nearer to the ends of the stripe. As a rotating magnetic field is applied to the stripe, the central magnetic moments may form a first magnetic domain (e.g., with a magnetization that is more aligned with the applied magnetic field), and the end magnetic moments may form a second magnetic domain (e.g., with a magnetization that is less aligned with the applied magnetic field).

Between the two magnetic domains, atoms of the magnetoresistive material may form a magnetic domain wall (e.g., a 180 degree domain wall) that transitions from the magnetization of the first magnetic domain and the magnetization of the second magnetic domain. As the applied magnetic field rotates, the physics of the stripe (e.g., energy costs for establishing interfaces between domains) may cause the magnetic domain wall to be annihilated so that the stripe is in a lower energy state (e.g., causing a greater degree of alignment between the magnetizations of the two magnetic domains). This annihilation of the magnetic domain wall causes a sudden, hard switching of the magnetization direction in some regions of the stripe, which creates a discontinuity in the observed electrical resistance of the stripe. This electrical discontinuity makes measurement of the applied magnetic field direction more difficult and less accurate, further resulting in a less accurate measurement of the speed of the moving magnet. Furthermore, annihilation of the magnetic domain wall may vary from cycle to cycle (e.g., as the magnetic field rotates), creating signal jitter. Implementations described herein result in a less sudden, soft switching of the magnetization in a stripe due to less pronounced (or eliminated) magnetic domain walls, resulting in less pronounced electrical discontinuities and better sensor performance. In some implementations, the magnetoresistive sensor may be operated in a rotating magnetic field with a magnetic field strength less than the magnetic field necessary to provide full saturation of the sensor layer rotating with the magnetic field.

Figure 1B:
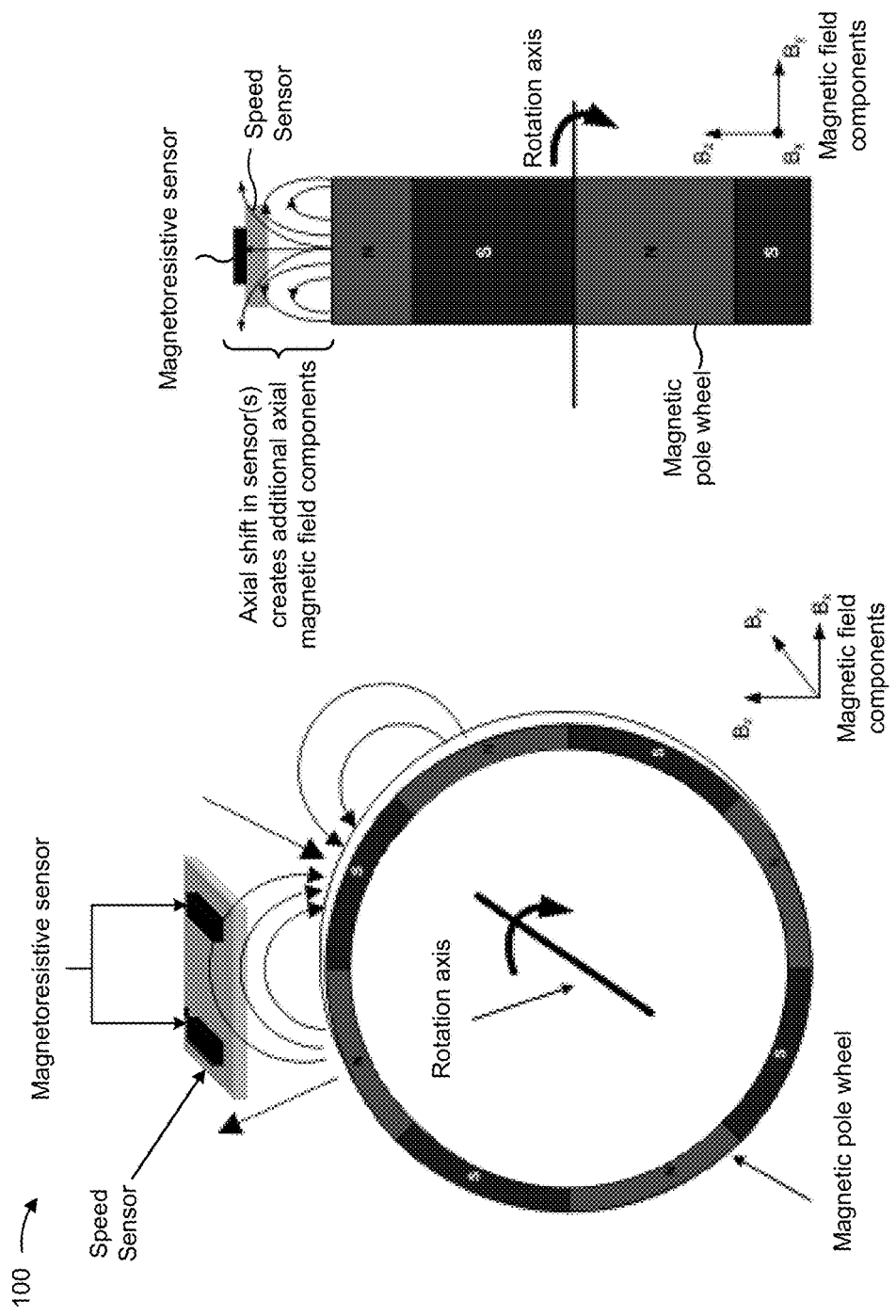
Figure 1C:
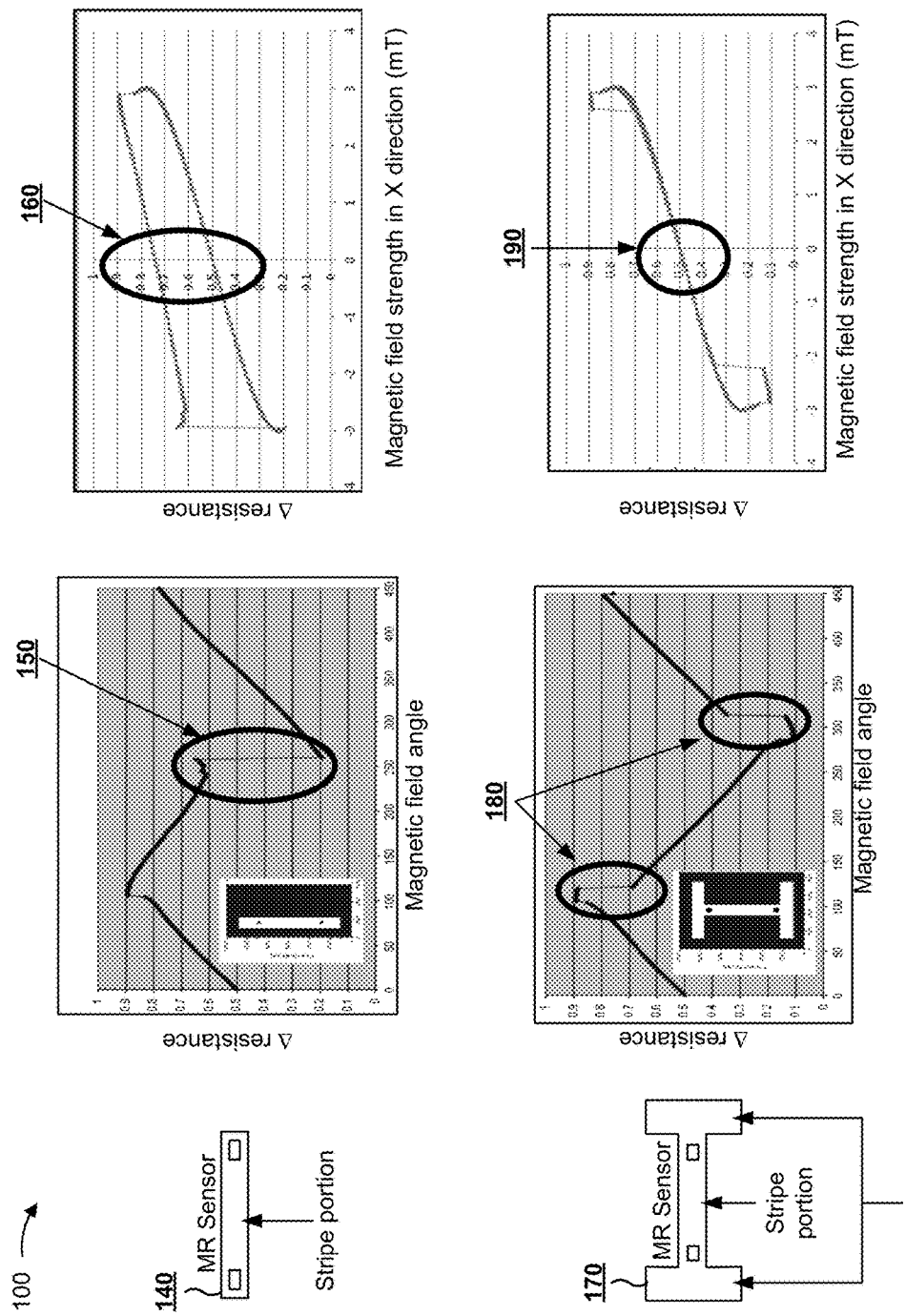

FIGS. 1A-1C are diagrams of an overview of an example implementation 100 described herein. As shown in FIG. 1A, and by reference number 110, a speed sensor that includes one or more magnetoresistive sensors may be positioned to measure the rotational speed of a magnetic pole wheel. The magnetic pole wheel may have alternating north pole and south pole magnetizations along the circumference of the wheel, which create an external magnetic field that is applied to the magnetoresistive sensors, as shown by reference number 120. The magnetic pole wheel shown in FIG. 1A is provided as an example, and other types of magnets may apply the external magnetic field to the magnetoresistive sensors, in some implementations.

As shown by reference number 130, assume that the applied magnetic field "B" has a direction defined by an angle Φ of 5 degrees below a length axis of a magnetoresistive stripe included in a magnetoresistive sensor. In this case, magnetic domains in a central region of the stripe may more easily align with the applied magnetic field than magnetic domains in an end region of the stripe, as shown. As further shown, this creates a magnetic domain wall between the magnetization of the central region and the magnetization of the end region. As the magnetic pole wheel rotates, the direction of the applied magnetic field will change, which may cause annihilation of the domain wall and a discontinuity in an electrical resistance measured by the magnetoresistive sensor.

As shown in FIG. 1B, the measured direction and/or strength of the applied magnetic field (e.g., in the $B_x$ direction) may depend on an axial position of the magnetoresistive sensor in relation to the magnetic pole wheel. An axial shift of the magnetoresistive sensor from the center of the magnetic pole wheel may introduce, in addition to the tangential uniaxial magnetic field components, additional perpendicular, axial magnetic field components. The additional, perpendicular axial magnetic field components may be phase shifted by approximately 90 degrees, resulting in an elliptic or circular rotation of the applied magnetic field vector. In other words, this axial shift may create magnetic field components measured in the $B_y$ direction, in addition to magnetic field components measured in the $B_x$ direction. This may result in inaccurate measurements of the magnetic field in the $B_x$ direction, which may be used to measure the rotational speed of the magnetic pole wheel.

As shown in FIG. 1C, and by reference number 140, a magnetoresistive sensor (shown as MR sensor) may include only a stripe portion, in some cases. In this case, and as shown by reference number 150, when the magnetoresistive sensor (shown as MR sensor) includes only a stripe portion, there is a large discontinuity in the electrical response of the magnetoresistive sensor (e.g., the change in resistance with respect to the change in the applied magnetic field angle) when the magnetic field angle is near 250 degrees. This large discontinuity is a result of annihilation of the magnetic domain wall. Furthermore, as shown by reference number 160, the change in resistance could have two different values for a particular magnetic field strength in the X direction (e.g., $B_x$, measured in milliTeslas, for example), depending on the direction in which the magnetic field is rotating. The may be referred to as hysteresis. In particular, the change in resistance could have a value near 0.5 or 0.7 when the magnetic field strength in the X direction is equal to zero milliTeslas (mT), as shown. In a magnetoresistive sensor, a value approximately equal to half of the maximum resistance change may correspond to a zero-crossing point in a Wheatstone bridge. For the purpose of FIG. 1C, a change in resistance value of 0.5 may be used as the zero-crossing point to evaluate the speed of a moving or rotating magnet. Thus, these different possible values of 0.5 or 0.7 may lead to poor sensor performance.

As shown by reference number 170, in some cases, the magnetoresistive sensor may include a stripe portion and extension portions that extend beyond the width of the stripe portion. In this case, and as shown by reference number 180, the large discontinuity in the electrical response is no longer present, and is replaced by smaller discontinuities at different magnetic field angles. As a result, and as shown by reference number 190, the change in resistance has one possible value when the magnetic field is equal to zero milliTeslas, which is near the value of 0.5, which may be used as the zero-crossing point of a bridge included in the magnetoresistive sensor. In this way, adding the extension portions to the stripe portion improves performance of the magnetoresistive sensor by reducing discontinuities in the electrical response, and by reducing hysteresis near the zero-crossing point value.

Figure 2:
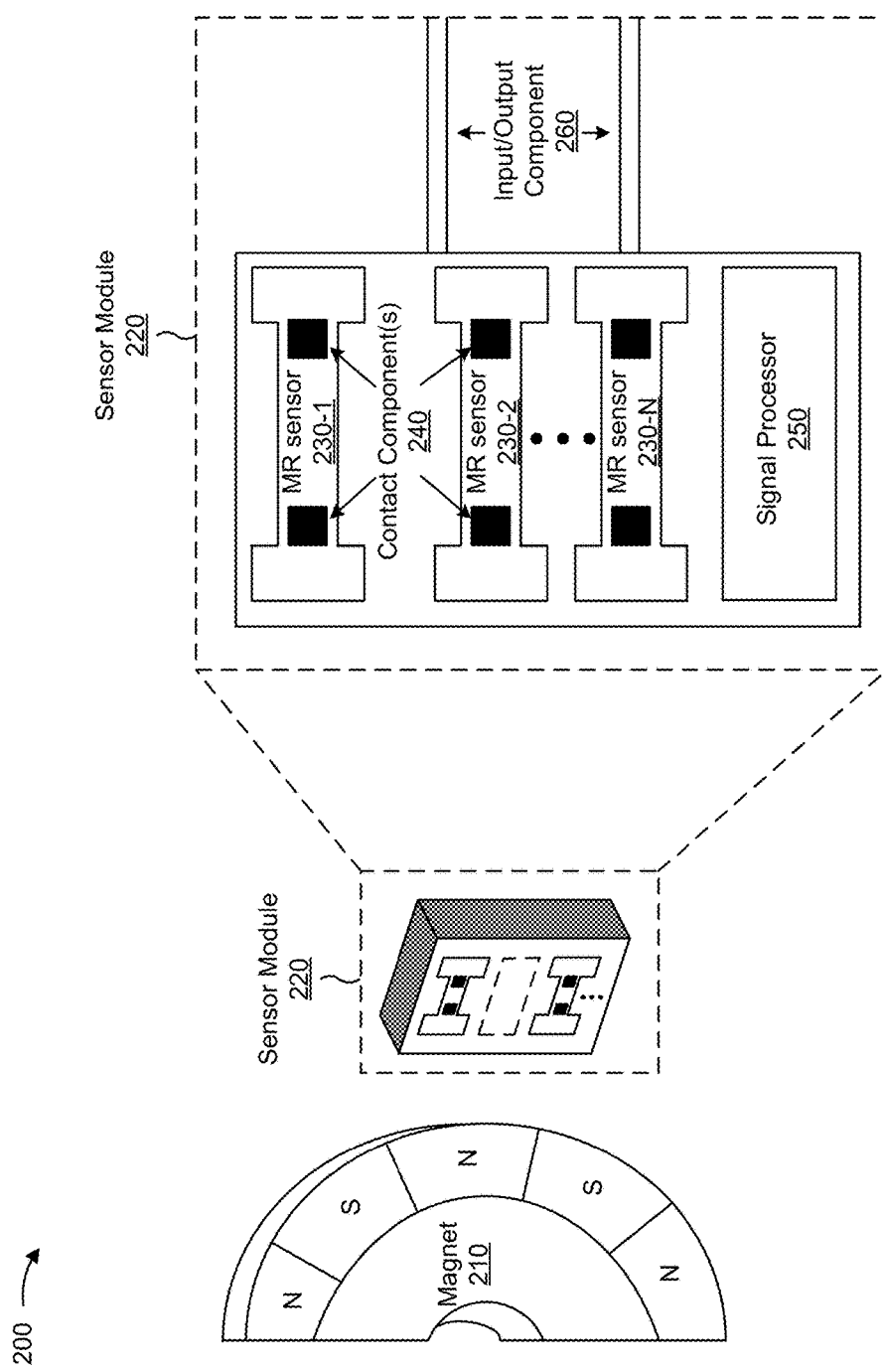
FIG. 2 is a diagram of an example environment in which apparatuses described herein may be implemented.

FIG. 2 is a diagram of an example environment 200 in which apparatuses described herein may be implemented. As shown in FIG. 2, environment 200 may include a magnet 210, a sensor module 220, a set of magnetoresistive sensors 230-1 through 230-N (N≥1) (shown as "MR sensor," and which may be referred to herein individually as "magnetoresistive sensor 230," and collectively as "magnetoresistive sensors 230"), a set of contact components 240, a signal processor 250, and input/output ("IO") component 260.

Magnet 210 may include one or more magnets. In some implementations, magnet 210 may include a magnetic pole wheel (e.g., with at least two alternating poles, such as a north pole and a south pole), as shown in FIG. 2. Additionally, or alternatively, magnet 210 may include a dipole magnet (e.g., a dipole bar magnet, a circular dipole magnet, an elliptical dipole magnet, etc.), a permanent magnet, an electromagnet, or the like. Magnet 210 may be comprised of a ferromagnetic material, and may produce a magnetic field. In some implementations, magnet 210 may be attached to or coupled with a structure for which a speed is to be measured, such as a wheel (e.g., a vehicle wheel), an axle (e.g., a vehicle axle), a cylindrical structure (e.g., a rotating cylinder, a camshaft, a crankshaft, etc.), a linearly moving object (e.g., a movable hydraulic piston), or the like.

Sensor module 220 may include one or more apparatuses for measuring a speed of magnet 210, such as a rotational speed, a linear speed, or the like. For example, sensor module 220 may include a speed sensor, such as a magnetic speed sensor, a rotational speed sensor, a linear speed sensor, a linear tilted speed sensor, a Hall sensor, or the like. Sensor module 220 may be positioned at a particular location relative to magnet 210, such that sensor module 220 may detect a magnetic field generated by magnet 210. As shown, sensor module 220 may include a set of magnetoresistive sensors 230, a set of contact components 240, a signal processor 250, and an IO component 260. Sensor module 220 and/or magnetoresistive sensor 230 may measure magnetoresistance using anisotropic magnetoresistance (AMR) technology, giant magnetoresistance (GMR) technology, tunnel magnetoresistance (TMR) technology, or the like.

Magnetoresistive sensor 230 may include one or more apparatuses for measuring magnetoresistance. For example, magnetoresistive sensor 230 may be comprised of a magnetoresistive material, such as nickel iron (NiFe). The electrical resistance of the magnetoresistive material may depend on a strength and/or a direction of an external magnetic field applied to the magnetoresistive material, such as a magnetic field generated by magnet 210. Magnetoresistive sensor 230 may include a stripe portion and one or more extension portions, as described in more detail herein in connection with FIGS. 3A-3H. As shown, magnetoresistive sensor 230 may include a set of contact components 240.

Contact component 240 may include one or more apparatuses for coupling magnetoresistive sensor 230 to an apparatus (e.g., included in sensor module 220) for measuring an electrical resistance of a magnetoresistive material included in magnetoresistive sensor 230. For example, contact component 240 may be coupled to an ohmmeter, such as a precision ohmmeter, a Kelvin bridge, or the like. Contact component 240 may further be coupled to (e.g., in contact with, positioned on, etc.) the magnetoresistive material included in magnetoresistive sensor 230. In some implementations, magnetoresistive sensor 230 may include two contact components 240. As an example, a first contact component 240 may be positioned nearer to a first end of magnetoresistive sensor 230, and a second contact component 240 may be positioned nearer to a second end (e.g., an opposite end) of magnetoresistive sensor 230. As another example, a first contact component 240 may be coupled to a first terminal of an apparatus for measuring electrical resistance, and a second contact component 240 (e.g., different from and possibly physically separated from the first contact component 240) may be coupled to a second terminal of the apparatus for measuring electrical resistance. In this way, sensor module 220 may measure the electrical resistance and/or the change in electrical resistance of the magnetoresistive material based on an external magnetic field applied to the magnetoresistive material (e.g., based on a change in resistance between a first contact component 240 and a second contact component 240).

Signal processor 250 may include one or more apparatuses for processing signals received from one or more magnetoresistive sensors 230. For example, signal processor 250 may include an analog signal processor, a digital signal processor, an application-specific integrated circuit (ASIC), a field-programmable gate array (FPGA), a microprocessor, or the like. In some implementations, signal processor 250 may process signals received from contact component 240, from multiple contact components 240 associated with a particular magnetoresistive sensor 230, from multiple contact components 240 associated with multiple magnetoresistive sensors 230, or the like. Additionally, or alternatively, signal processor 250 may determine a speed of magnet 210 based on signals received from one or more contact components 240.

IO component 260 may include one or more apparatuses for inputting information to sensor module 220 and/or outputting information from sensor module 220. For example, IO component 260 may include an input component, an output component, a bus, a wire, a pin, or the like. In some implementations, IO component 260 may receive a signal for sensor module 220 (e.g., a signal requesting a speed measurement). Additionally, or alternatively, IO component 260 may transmit a signal from sensor module 220 (e.g., a signal that indicates a speed measurement). IO component 260 may permit sensor module 220 to communicate with other components, such as a computing device, a microprocessor, or the like.

The number and arrangement of apparatuses shown in FIG. 2 are provided as an example. In practice, there may be additional apparatuses, fewer apparatuses, different apparatuses, or differently arranged apparatuses than those shown in FIG. 2. Furthermore, two or more apparatuses shown in FIG. 2 may be implemented within a single apparatus, or a single apparatus shown in FIG. 2 may be implemented as multiple, distributed apparatuses. Additionally, or alternatively, a set of apparatuses (e.g., one or more apparatuses) of environment 200 may perform one or more functions described as being performed by another set of apparatuses of environment 200.

Figure 3A:
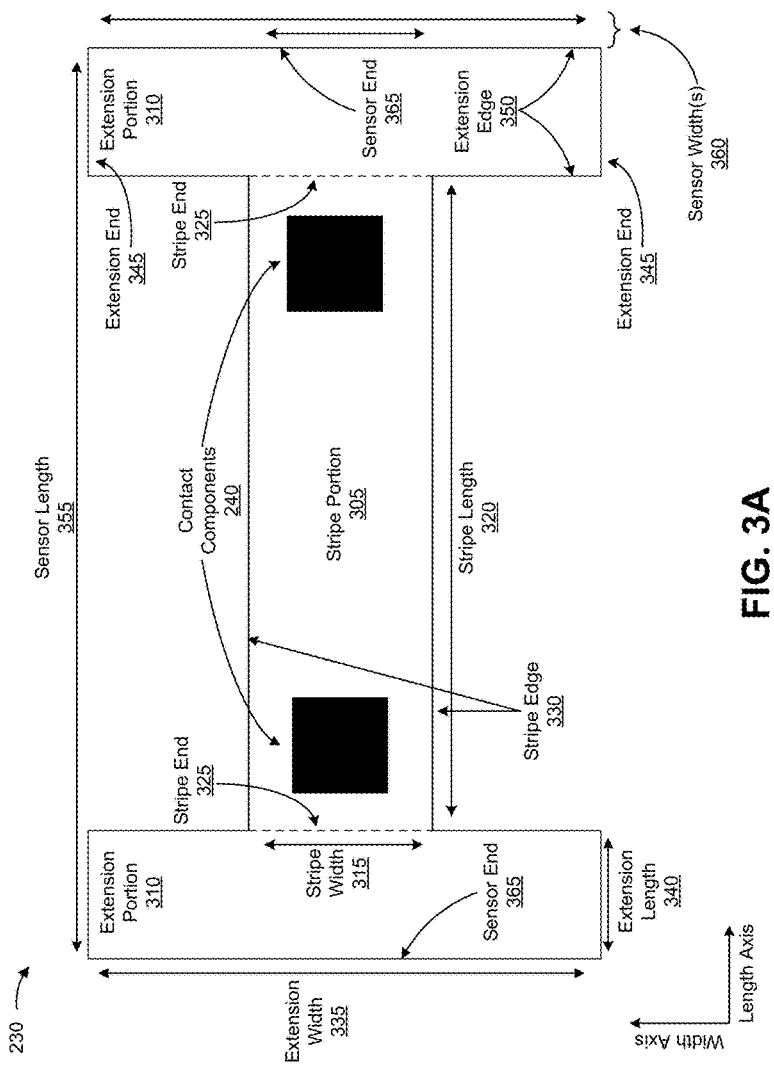

FIG. 3A is a diagram of an example magnetoresistive sensor 230, according to some possible implementations. As shown in FIG. 3A, magnetoresistive sensor 230 may include a stripe portion 305 and one or more extension portions 310. Stripe portion 305 and extension portion(s) 310 may comprise a continuous structure of magnetoresistive material, in some implementations. In other words, a single sheet or layer of magnetoresistive material may include stripe portion 305 and extension portion(s) 310. In some implementations, stripe portion 305 and/or extension portion 310 may be rectangular in shape. Additionally, or alternatively, stripe portion 305 and/or extension portion 310 may have other shapes, as described in more detail elsewhere herein.

In some implementations, the magnetoresistive material of stripe portion 305 may be the same as the magnetoresistive material of extension portion 310. In some implementations, a first magnetoresistive material, of stripe portion 305, may be different than a second magnetoresistive material of extension portion(s) 310. In this case, the first magnetoresistive material and the second magnetoresistive material may be magnetically coupled. The magnetic coupling may be direct, in some implementations. For example, the first magnetoresistive material may be in contact with the second magnetoresistive material (e.g., the first magnetoresistive material may cover the second magnetoresistive material, or the second magnetoresistive material may cover the first magnetoresistive material). In some implementations, the magnetic coupling may be indirect. For example, a layer of material may be placed between the first magnetoresistive material and the second magnetoresistive material to mediate the magnetic coupling. Indirect coupling may, in some cases, establish a ferromagnetic or antiferromagnetic coupling between the first magnetoresistive material and the second magnetoresistive material.

Stripe portion 305 may be comprised of a magnetoresistive material. Furthermore, stripe portion 305 may have a stripe width 315 along a first axis (i.e., a width axis), and a stripe length 320 along a second axis (i.e., a length axis). The second axis may be perpendicular to the first axis (or substantially perpendicular, such as within 1 degree, 3 degrees, 5 degrees, 10 degrees, etc.). In some implementations, stripe length 320 may be longer than stripe width 315, as shown. Stripe portion 305 may have a first stripe end 325 and a second stripe end 325, and stripe ends 325 may be positioned at opposite ends of stripe portion 305 along the length axis. Similarly, stripe portion 305 may have a first stripe edge 330 and a second stripe edge 330, and stripe edges 330 may be positioned at opposite ends of stripe portion 305 along the width axis. In some implementations, stripe width 315 may extend, in the direction of the width axis, from the first stripe edge 330 of stripe portion 305 (e.g., a lower stripe edge of stripe portion 305 shown in FIG. 3A) to the second stripe edge 330 of stripe portion 305 (e.g. an upper stripe edge of stripe portion 305 shown in FIG. 3A). While stripe portion 305 is shown as having a uniform stripe width 315, stripe portion 305 may have a non-uniform stripe width 315, in some implementations (e.g., may have different stripe widths 315 at different positions of stripe portion 305). In some implementations, stripe width 315 may refer to a width of stripe portion 305 at stripe end 325 (e.g., at a first stripe end 325, or at a second stripe end 325).

Extension portion 310 may be comprised of a magnetoresistive material (e.g., the same magnetoresistive material as stripe portion 305, a different magnetoresistive material than stripe portion 305, etc.). Furthermore, extension portion 310 may have an extension width 335 along the first axis (i.e., the width axis), and an extension length 340 along the second axis (i.e., the length axis). In some implementations, extension width 335 may be longer than extension length 340, as shown. Extension portion 310 may have a first extension end 345 and a second extension end 345, and extension ends 345 may be positioned at opposite ends of extension portion 310 along the width axis. Similarly, extension portion 310 may have a first extension edge 350 and a second extension edge 350, and extension edges 350 may be positioned at opposite ends of extension portion 310 along the length axis.

As further shown in FIG. 3A, extension portion 310 may be positioned at stripe end 325. In some implementations, magnetoresistive sensor 230 may include a single extension portion 310 positioned at one stripe end 325 of stripe portion 305. In some implementations, magnetoresistive sensor 230 may include two extension portions 310 positioned at opposite stripe ends 325 of stripe portion 305, as shown. In some implementations, magnetoresistive sensor 230 may include a different quantity of extension portions 310.

Extension portion 310 may extend the width of stripe portion 305. In other words, extension width 335 of extension portion 310 may be greater than (e.g., longer than, wider than, larger than, etc.) stripe width 315 of stripe portion 305. In yet other words, a width of magnetoresistive sensor 230 at extension portion 310 may be greater than a width of magnetoresistive sensor 230 at stripe portion 305. In some implementations, extension portion 310 may extend beyond both stripe edges 330 of stripe portion 305 along the width axis. For example, in FIG. 3A, an upper extension end 345 of extension portion 310 is located above an upper stripe edge 330 of stripe portion 305, and a lower extension end 345 of extension portion 310 is located below a lower stripe edge 330 of extension portion 305. Extension portion 310 may have a variety of shapes, some examples of which are described herein in connection with FIGS. 3B-3H.

As further shown in FIG. 3A, magnetoresistive sensor 230 may have a sensor length 355 along the second axis (i.e., the length axis). In some implementations, sensor length 355 may be uniform (e.g., may have the same length) throughout magnetoresistive sensor 230, as shown in FIG. 3A. In some implementations, sensor length 355 may be non-uniform (e.g., may have different lengths) throughout magnetoresistive sensor 230 (e.g., as shown by FIGS. 3B, 3C, and 3E). Furthermore, magnetoresistive sensor 230 may have a non-uniform sensor width 360 along the first axis (i.e., the width axis). For example, sensor width 360 may be narrower at stripe portion 305, and may be wider at extension portion 310. As further shown, magnetoresistive sensor 230 may have a first sensor end 365 and a second sensor end 365, and sensor ends 365 may be positioned at opposite ends of magnetoresistive sensor 230 along the length axis.

As further shown in FIG. 3A, in some implementations, contact component 240 may be positioned entirely on stripe portion 305 (e.g., may only contact stripe portion 305, and not extension portion 310). In this way, sensor module 220 may obtain a more accurate magnetoresistance measurement because the influence of generating and/or annihilating magnetic domain walls in extension portions 310 on the output signal is reduced or eliminated, since extension portions 310 are at least partly or even completely electrically excluded from the electrical sensor response. This may result in fewer discontinuities in the electrical response (e.g., fewer discontinuous changes in resistivity) measured by sensor module 220. As another example, contact component 240 may be positioned entirely on extension portion 310 (e.g., may only contact extension portion 310, and not stripe portion 305). As another example, contact component 240 may be positioned partially on stripe portion 305 and partially on extension portion 310.

In some implementations, a center of and/or an edge of contact component 240 may be positioned at a position that is at least twice the length of extension length 340 from sensor end 365. Additionally, or alternatively, magnetoresistive sensor 230 may include multiple contact components 240. For example, and as shown in FIG. 3A, magnetoresistive sensor 230 may include two contact components 240. In this case, a first contact component 240 may be positioned nearer to the first stripe end 325 (or a first sensor end 365) than the second stripe end 325 (or a second sensor end 365). Similarly, a second contact component 240 may be positioned nearer to the second stripe end 325 (or the second sensor end 365) than the first stripe end 325 (or the first sensor end 365).

The number, arrangement, and configuration of stripe portion 305, extension portions 310, and contact components 240 shown in FIG. 3A are provided as an example. In practice, magnetoresistive sensor 230 may include additional stripe portions 305, extension portions 310, or contact components 240, fewer stripe portions 305, extension portions 310, or contact components 240, or differently arranged stripe portions 305, extension portions 310, or contact components 240 than those shown in FIG. 3A. For example, although FIG. 3A shows magnetoresistive sensor 230 as including two extension portions 310, one at either stripe end 325 of stripe portion 305, in some implementations, magnetoresistive sensor 230 may include a single extension portion 310 (e.g., at one stripe end 325 of stripe portion 305). Additionally, or alternatively, contact component 240 may overlap one or the both stripe edges 330. For example, contact component 240 may include an electrical connector (e.g., a via) that is not positioned entirely on magnetoresistive sensor 230.

FIGS. 3B-3E are diagrams of other example magnetoresistive sensors 230, according to some possible implementations. As shown by FIGS. 3B-3E, magnetoresistive sensor 230 may be formed in a variety of shapes.

As shown by FIG. 3B, magnetoresistive sensor 230 may be formed with extension portion 310 as a disk structure, where extension portion 310 is round or circular in shape (e.g., in the shape of a circle). In this structure, extension width 335 of extension portion 310 may be wider than stripe width 315 of stripe portion 305. Furthermore, extension portion 310 may have a non-uniform width, with some widths being wider than stripe width 315 and some widths being narrower than stripe width 315. By using this shape, or another shape where the maximum extension width 335 is slightly wider than stripe width 315 (e.g., less or equal to than 1.5 times as wide, less than or equal to twice as wide, less than or equal to three times as wide, etc.), multiple magnetoresistive sensors 230 may be packed together in sensor module 220, as described in more detail in connection with FIGS. 4A-4C. In other words, when the maximum sensor width 360 is narrower (e.g., when the maximum extension width 335 is narrower), more magnetoresistive sensors 230 may be placed into a particular area than when the maximum sensor width 360 (or maximum extension width 335) is wider.

As shown by FIG. 3C, magnetoresistive sensor 230 may be formed with extension portion 310 as an ellipse structure, where extension portion 310 is elliptical in shape (e.g., in the shape of an ellipse). In this structure, extension portion 310 may have a non-uniform width. In some implementations, all extension widths 335 in this structure may be wider than stripe width 315. Differently shaped extensions portions 310, such as an elliptical shape, may provide different benefits, such as fewer electrical discontinuities, smaller electrical discontinuities, electrical discontinuities at different magnetic field directions or strengths, or the like. For example, an ellipse structure and/or a disk structure may avoid or reduce the generation of magnetic domain walls within extension portion 310, thereby improving sensor performance.

As shown by FIG. 3D, magnetoresistive sensor 230 may be formed with extension portion 310 as a yoke structure, where extension portion 310 is shaped like a yoke. In this structure, extension portion 310 may include an additional extension portion at extension end 345 of extension portion 310. The additional extension portion may extend along the length axis of magnetoresistive sensor 230. In this case, extension portion 310 may have different extension lengths 340. Differently shaped extensions portions 310, such as a yoke shape, may provide different benefits, such as fewer electrical discontinuities, smaller electrical discontinuities, electrical discontinuities at different magnetic field directions or strengths, or the like.

As shown by FIG. 3E, magnetoresistive sensor 230 may be formed with extension portion 310 as an arrow structure, where extension portion 310 is shaped like an arrowhead. In this structure, extension portion 310 may extend at a particular angle (e.g., 30 degrees, 45 degrees, a range between 10 and 170 degrees, etc.) from the length axis and/or the width axis. As shown by this shape, magnetoresistive sensor 230 may have a non-uniform sensor length 355.

In some implementations, magnetoresistive sensor 230 may include a rounded stripe end 325 between extension portion 310 and stripe portion 305 (e.g., when extension portion 310 is round, circular, elliptical, etc., in shape, as shown in FIGS. 3B and 3C). In some implementations, magnetoresistive sensor 230 may have a bone shape. Differently shaped extensions portions 310, such as an arrowhead shape, may provide different benefits, such as fewer electrical discontinuities, smaller electrical discontinuities, electrical discontinuities at different magnetic field directions or strengths, or the like.

As indicated above, FIGS. 3B-3E show example structures for magnetoresistive sensor 230. In some implementations, magnetoresistive sensor 230 may have a different shape than those shown (e.g., a rounded rectangle shape, a concave shape, a convex shape, etc.). In some implementations, magnetoresistive sensor 230 may include the same shape at either stripe end 325 of stripe portion 305. In some implementations, magnetoresistive sensor 230 may include different shapes at either stripe end 325 of stripe portion 305. In other words, a first extension portion 310 (e.g., positioned at a first stripe end 325) and a second extension portion 310 (e.g., positioned at a second stripe end 325) may be symmetrical (e.g., may have the same shape and/or dimensions) or asymmetrical (e.g., may have different shapes and/or dimensions). Further, the lengths and widths of stripe portion 305 and extension portion 310 are shown as an example. In practice, stripe portion 305 and/or extension portion 310 may have different lengths and/or widths than shown. Additionally, or alternatively, different magnetoresistive sensors 230, within a particular sensor module 220, may have different shapes.

Figure 3F:
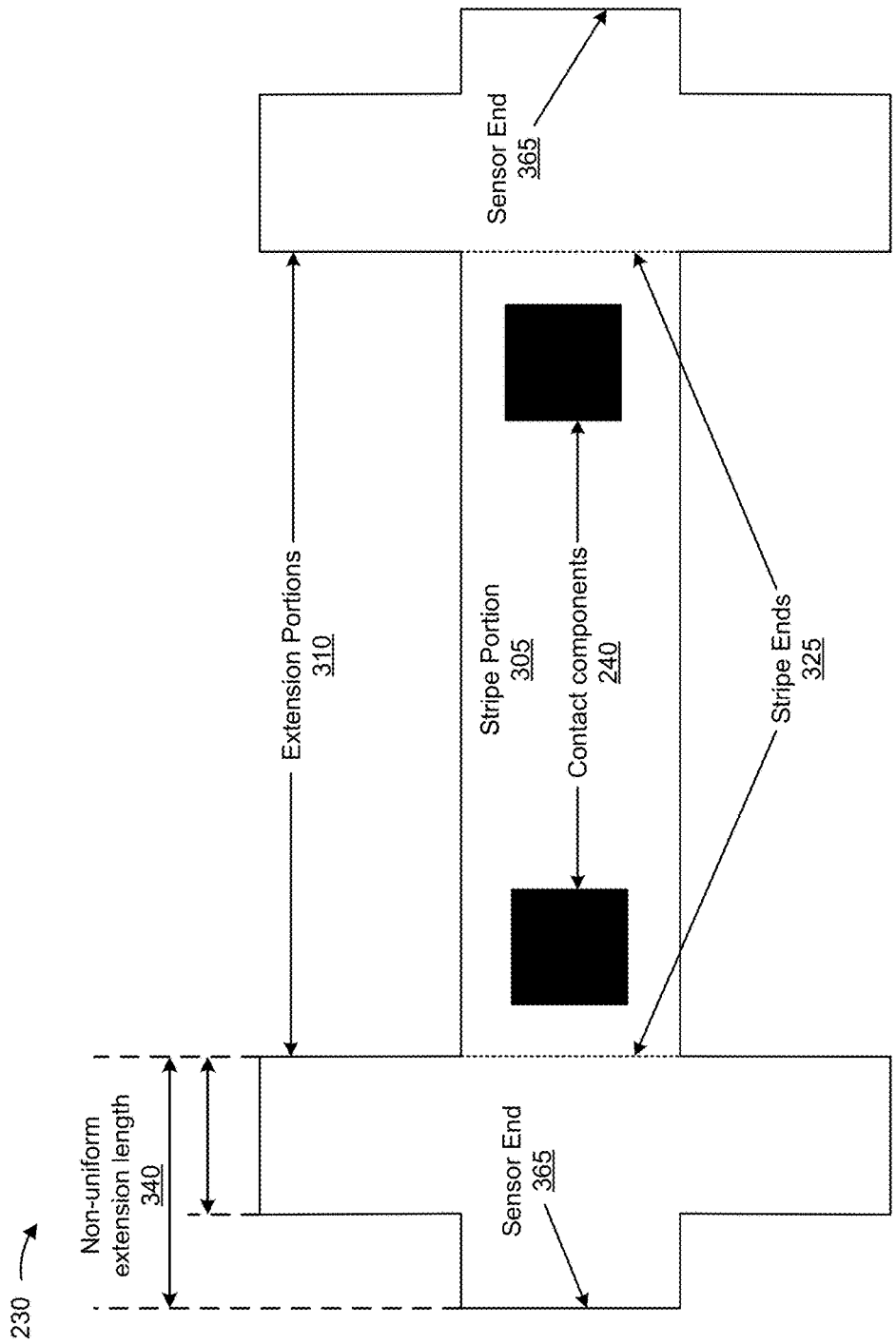

FIGS. 3F-3H are diagrams of other example magnetoresistive sensors 230, according to some possible implementations. As shown by FIGS. 3F-3H, magnetoresistive sensor 230 may be formed in a variety of shapes, and contact components 240 may be placed at different positions on magnetoresistive sensor 230.

As shown by FIG. 3F, extension portion 310 may have a non-uniform extension length 340, in some implementations. As further shown, stripe end 325 may not be the same as sensor end 365. Additionally, or alternatively, contact component 240 may be positioned entirely within stripe portion 305, in some implementations. As shown by FIG. 3G, contact component 240 may be positioned entirely within extension portion 310, in some implementations. As shown by FIG. 3H, contact component 240 may be positioned partially within stripe portion 305 and partially within extension portion 310, in some implementations.

As indicated above, FIGS. 3F-3H show example structures for magnetoresistive sensor 230. In some implementations, magnetoresistive sensor 230 may have a different shape than those shown. Additionally, or alternatively, contact component 240 may be positioned at a different position than shown. Additionally, or alternatively, magnetoresistive sensor 230 may include only a single extension portion 310, rather than the two extension portion 310 shown in FIGS. 3F-3H.

FIGS. 4A-4C are diagrams of example sensor modules 220, according to some possible implementations. As shown by FIGS. 4A-4C, sensor module 220 may include multiple magnetoresistive sensors 230. One or more of the magnetoresistive sensors 230 included in sensor module 220 may include stripe portion 305 and extension portion(s) 310. Additionally, or alternatively, magnetoresistive sensors 230 may be positioned on a substrate material.

As shown by FIG. 4A, magnetoresistive sensors 230 may be separated by the substrate material, in some implementations. As shown by FIG. 4B, differently shaped magnetoresistive sensors 230 (e.g., differently shaped extension portions 310) may permit a greater or lesser quantity of magnetoresistive sensors to fit within sensor module 220 of a particular size. For example, with a beam-shaped structure (shown by FIG. 4A), four magnetoresistive sensors 230 may fit within sensor module 220 of a particular size, while with a disk-shaped structure (shown by FIG. 4B), five magnetoresistive sensors 230 may fit within sensor module 220 of the same, particular size. By permitting a greater number of magnetoresistive sensors 230 to fit within sensor module 220 of a particular size, sensor performance may be improved without increasing the size of sensor module 220.

As shown by FIG. 4C, extension portions 310 of multiple magnetoresistive sensors may form a single structure. For example, adjacent stripe portions 305 may share an extension portion 310. Additionally, or alternatively, multiple stripe portions 305, separated by the substrate material, may share extension portion(s) 310.

In some implementations, at least two magnetoresistive sensors 230 may be electrically coupled in series (e.g., contact components 240 of different magnetoresistive sensors 230 may be electrically coupled in series) to create a resistor with a particular resistance value. In this way, sensor module 220 may be designed with a particular resistance value (e.g., to lower the amount of electrical current consumed by sensor module 220). Additionally, or alternatively, multiple magnetoresistive sensors 230 may be combined to form a Wheatstone bridge. For example, two magnetoresistive sensors 230 (or two resistors comprised of at least two magnetoresistive sensors, each) may be combined to form a Wheatstone half-bridge. As another example, four magnetoresistive sensors 230 (or four resistors comprised of at least two magnetoresistive sensors each) may be combined to form a Wheatstone full-bridge.

As indicated above, FIGS. 4A-4C show example quantities, configurations, and shapes of magnetoresistive sensors 230 included in sensor module 220. In some implementations, sensor module 220 may include different quantities, configurations, and/or shapes of magnetoresistive sensors 230 than those shown. For example, rather than uniform-shaped magnetoresistive sensors 230, sensor module 220 may include magnetoresistive sensors 230 of different shapes in the same sensor module 220.

Figure 5:
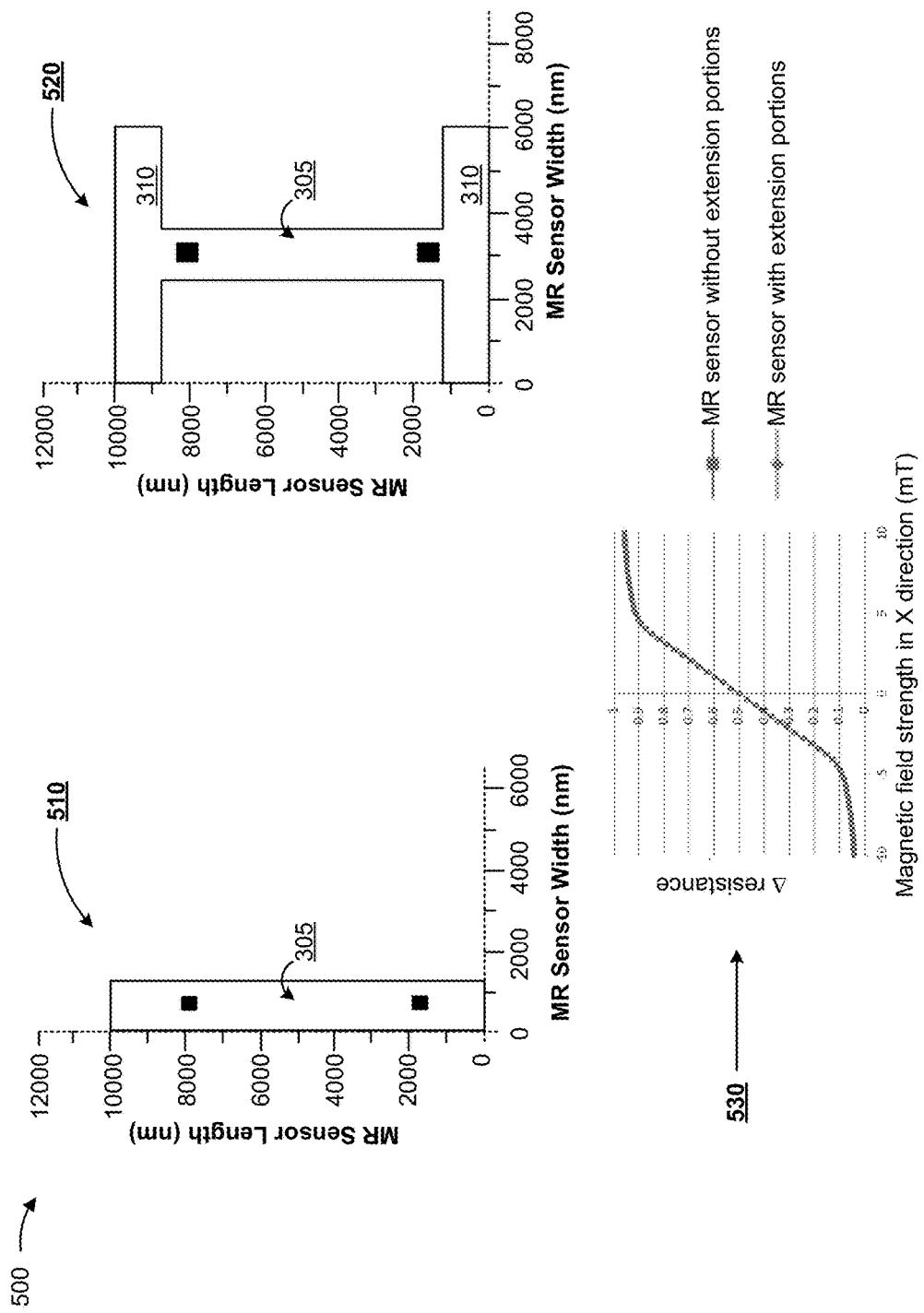
FIG. 5 is a diagram that shows example properties of a magnetoresistive sensor according to some implementations described herein.

FIG. 5 is a diagram that shows example properties 500 of magnetoresistive sensor 230 according to some possible implementations. FIG. 5 compares properties 500 of an example magnetoresistive sensor 230 without extension portions 310 and an example magnetoresistive sensor 230 with extension portions 310.

As shown by reference number 510, assume that a magnetoresistive sensor 230, that does not include extension portions 310 (e.g., that only includes stripe portion 305), has a sensor length of 10,000 nanometers (nm), and a sensor width of 1,200 nm. This sensor length and sensor width are provided as examples, and magnetoresistive sensor 230 may have other sensor lengths and sensor widths, in some implementations.

As shown by reference number 520, assume that magnetoresistive sensor 230, that includes extension portions 310, has a sensor length of 10,000 nm, and a sensor width of 6,000 nm. Again, this sensor length and sensor width are provided as examples, and other sensor lengths and sensor widths are possible.

As an example, stripe width 315 may be in the range of approximately 200 nm to approximately 10,000 nm. In some implementations, stripe width 315 may be substantially equal to 1,000 nm, within a tolerance range. As another example, stripe length 320 may be in the range of approximately 600 nm to approximately 30,000 nm. In some implementations, stripe length 320 may be substantially equal to 10,000 nm, within a tolerance range. In some implementations, stripe length 320 may be substantially equal to (e.g., within a tolerance range of) three times stripe width 315.

As another example, extension width 335 may be in the range of approximately 300 nm to approximately 100,000 nm. In some implementations, extension width 335 may be substantially equal to 3,000 nm, within a tolerance range. In some implementations, extension width 335 may be within a range of approximately 1.5 times stripe width 315 to approximately ten times stripe width 315. As another example, extension length 340 may be in the range of approximately 100 nm to approximately 50,000 nm. In some implementations, extension length 340 may be substantially equal to 1,000 nm, within a tolerance range. In some implementations, extension length 340 may be within a range of approximately half of stripe width 315 to approximately five times stripe width 315.

As shown by reference number 530, both magnetoresistive sensors 230 shown in FIG. 5 exhibit similar electrical responses (changes in electrical resistance) across a range of magnetic field strengths (e.g., pictured from −10 mT to 10 mT). Thus, a magnetoresistive sensor 230, with extension portions 310, may be used to measure electrical responses for the same range of magnetic fields as a magnetoresistive sensor 230 without extension portions 310, while improving sensor performance, as described in more detail elsewhere herein (e.g., in connection with FIG. 6).

As indicated above, FIG. 5 shows example properties of magnetoresistive sensor 230. Other examples are possible and may differ from what was described with regard to FIG. 5. For example, magnetoresistive sensor 230 may have other lengths and/or widths than those described (e.g., greater than those described, less than those described, etc.).

Figure 6:
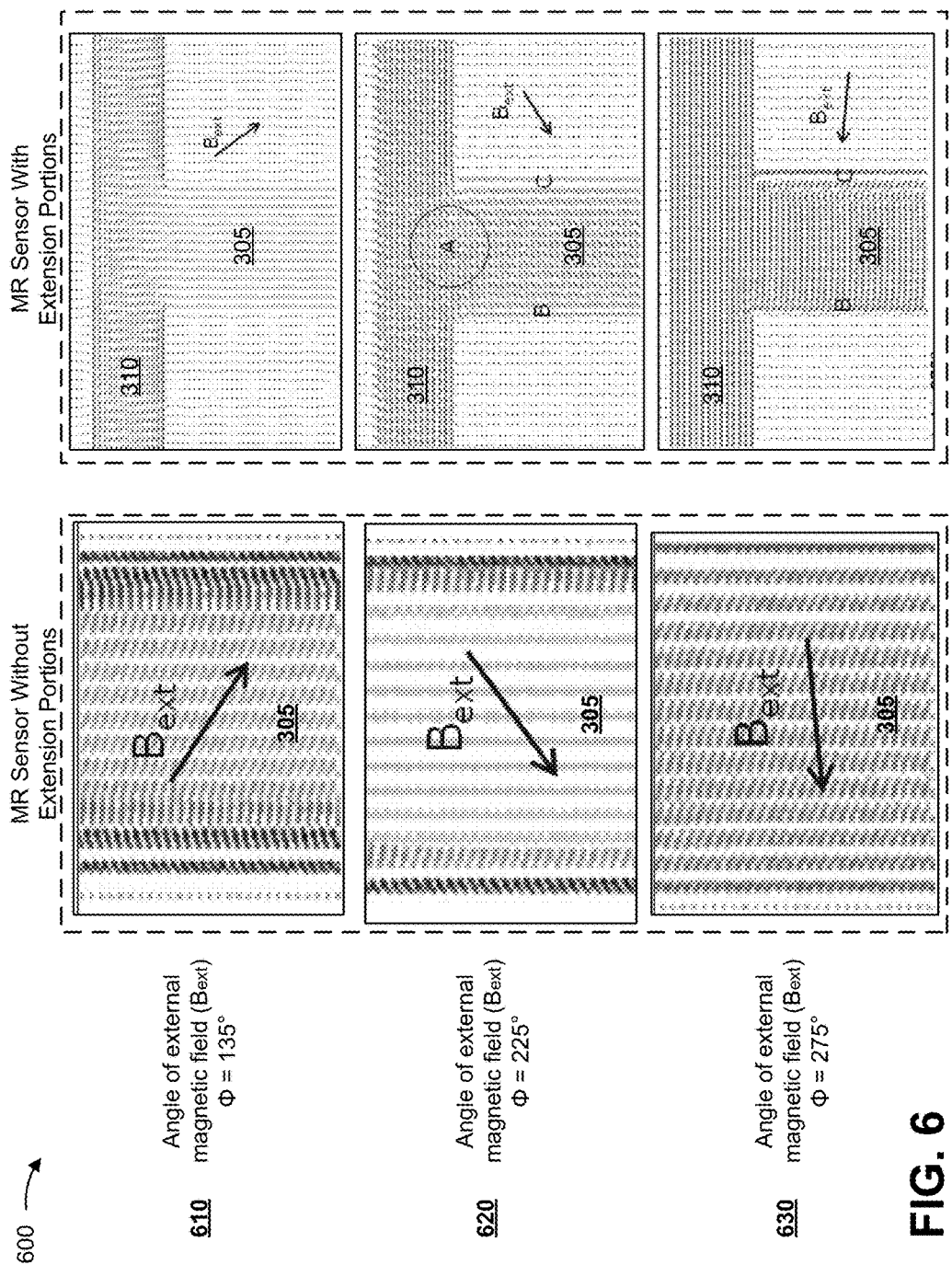
FIG. 6 is a diagram that shows other example properties of a magnetoresistive sensor according to some implementations described herein.

FIG. 6 is a diagram that shows other example properties 600 of magnetoresistive sensors 230 according to some possible implementations. FIG. 6 shows example properties of a magnetoresistive sensor 230 without extension portions 310 (in a left column), and example properties of a magnetoresistive sensor 230 with extension portions 310 (in a right column). It should be noted that the left column is drawn at a different scale in comparison to the right column. For the purpose of FIG. 6, however, assume that the widths of the stripe portions shown in the left column are the same as the widths of the stripe portions shown in the right column.

As shown by reference number 610, when an external magnetic field (Bert) with an angle of 135 degrees is applied to a magnetoresistive sensor 230 without extension portion(s) 310, magnetic domains in the central region of stripe portion 305 are generally aligned with the external magnetic field, while magnetic domains in the end region are not. When the same external magnetic field (with the same angle) is applied to a magnetoresistive sensor 230 with extension portion(s) 310 (as shown in the right column of FIG. 6), magnetic domains in the central region of stripe portion 305 are still aligned with the external magnetic field, and magnetic domains in the end region of stripe portion 305 are more aligned with the external magnetic field than the magnetic domains in the end region of magnetoresistive sensor 230 without extension portion 310.

As further shown, in the magnetoresistive sensor 230 with extension portion 310, magnetic domains in extension portion 310 are less aligned with the external magnetic field than magnetic domains in stripe portion 305. In this case, all magnetization regions point to the same half-space. A half-space may refer to either of the two regions into which a plane, perpendicular to a sensor plane of magnetoresistive sensor 230, divides three-dimensional Euclidean space. Due to the shape anisotropy of magnetoresistive sensor 230, the magnetization at the extension edges of extension portion 310 are more horizontally aligned (e.g., along the width axis of MR sensor 230), and the magnetization of the stripe edges of stripe portion 305 are more vertically aligned (e.g., along the length axis of MR sensor 230). In this case, a measurement by contact component 240 in stripe portion 305 may be more accurate than a measurement in extension portion 310. Furthermore, a measurement by contact component 240 when magnetoresistive sensor 230 includes extension portion 310 may be more accurate than a measurement by contact component 240 when magnetoresistive sensor 230 does not include extension portion 310.

As shown by reference number 620, assume that the external magnetic field is rotated to 225 degrees. As this magnetic field is applied to the magnetoresistive sensor 230 without extension portion(s) 310 (as shown in the left column) magnetic domains in the central region of stripe portion 305 become less aligned with the external magnetic field, and a magnetic domain wall is formed between magnetic domains in the central region and magnetic domains in the end region (e.g., as indicated by "B" and "C"). When the same external magnetic field (with the same angle) is applied to the magnetoresistive sensor 230 with extension portion(s) 310 (as shown in the corresponding sub-figure in the right column), magnetic domains in both regions of stripe portion 305 are more aligned with the external magnetic field. Since the central and edge magnetic domains have a magnetization direction pointing into the same half space, no 180 degree domain wall (or a less pronounced magnetic domain wall) is formed. In this case, extension portion 310 may be magnetized toward the left, and the top region of stripe portion 305 (e.g., near extension portion 310, indicated by "A"), may exhibit a magnetization direction that rotates ahead of the magnetization of regions further from extension portion 310. This supports re-magnetization of stripe portion 305 (e.g., without creating or annihilating a domain wall, or by creating a less pronounced domain wall).

In some implementations, magnetoresistive sensor 230 may include stripe portion 305 having a shape anisotropy axis along a first axis. Additionally, or alternatively, magnetoresistive sensor 230 may include extension portion 310, at stripe end 325, having a shape anisotropy along a second axis. The second axis may be different from the first axis. In some implementations, a first and second extension portion 310 may have a second and third anisotropy axis. respectively. The second and third anisotropy axis may be different from each other, and/or may be different from the first anisotropy axis of stripe portion 305. In some implementations, extension portion 310 may exhibit a local shape anisotropy axis (e.g., where extension portion 310 is circular in shape). As a whole, a circular structure may not exhibit a shape anisotropy. However domains near the edge of the circulate structure (e.g., near stripe edge 325) are forced to align parallel to the edge. In other words, domains near the edge of the circular structure exhibit a local shape anisotropy, which enables the swift switching effect described herein.

As shown by reference number 630, assume that the external magnetic field is rotated to 275 degrees. In this case, the magnetic domain wall formed in the magnetoresistive sensor 230 without extension portion(s) 310 has been annihilated, causing a sudden change in the electrical response. When the same external magnetic field (with the same angle) is applied to the magnetoresistive sensor 230 with extension portion(s) 310, magnetic domains in both regions of stripe portion 305 remain aligned with the external magnetic field, and there is no annihilation of a magnetic domain wall. Thus, the magnetoresistive sensor 230 with extension portion(s) 310 does not undergo a sudden change in electrical resistance, thus increasing performance of sensor module 220 that includes magnetoresistive sensor 230. Thus, as shown in FIG. 6, including extension portions 310 in magnetoresistive sensor 230 influences the re-magnetization behavior of stripe portion 305.

As indicated above, FIG. 6 shows example properties of magnetoresistive sensor 230. Other examples are possible and may differ from what was described with regard to FIG. 6 (e.g., when magnetoresistive sensor 230 and/or extension portions 310 have different sizes, shapes, orientations, etc.). In some implementations, the magnetoresistive material of magnetoresistive sensor 230 may include a sensor layer or free layer of a GMR spin-valve sensor. In some implementations, the magnetoresistive material of magnetoresistive sensor 230 may include a sensor layer or free layer of a TMR spin-valve sensor.

Figure 7:
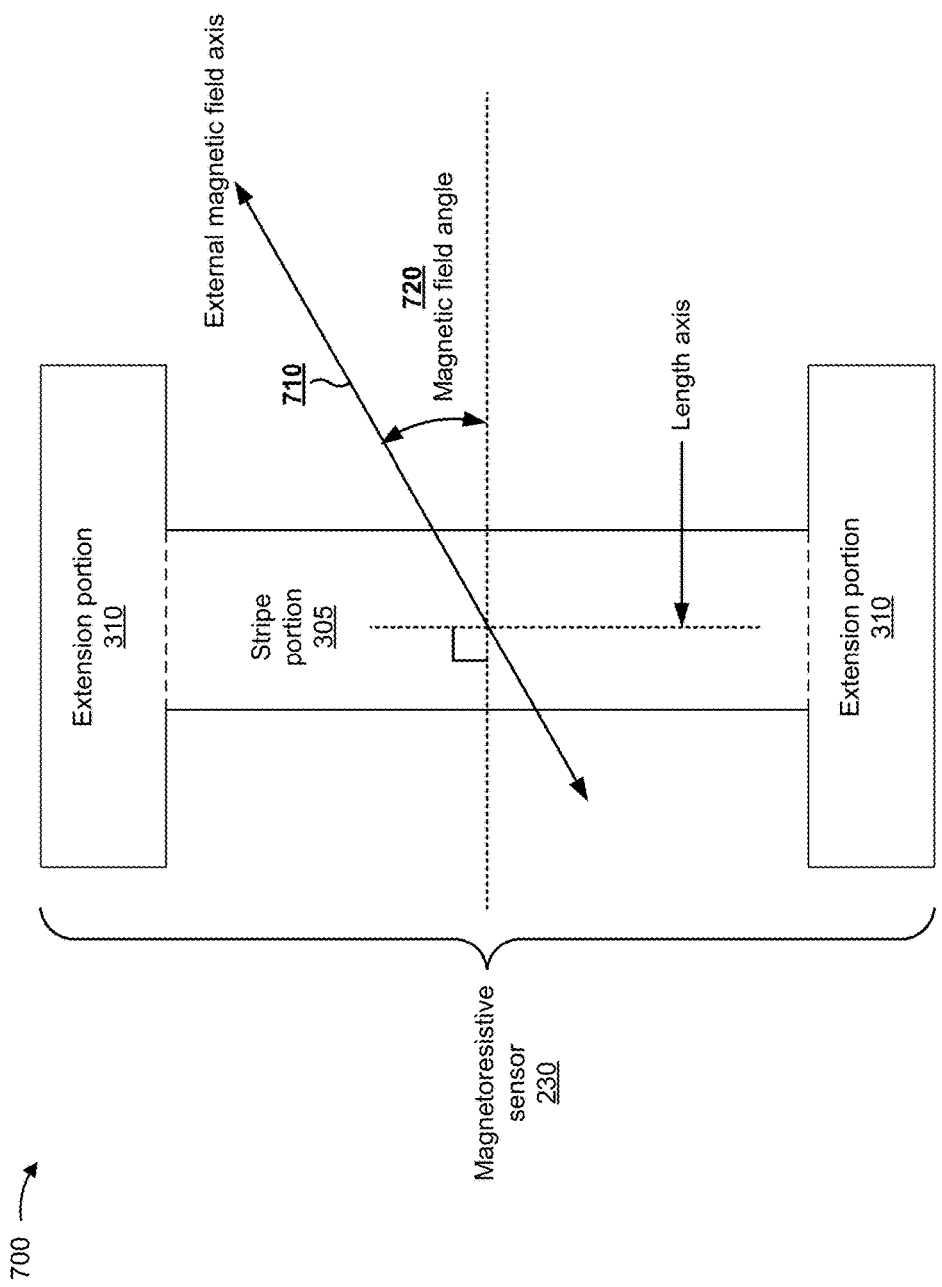
FIG. 7 is a diagram of an example of applying a uniaxial external magnetic field to a magnetoresistive sensor.

FIG. 7 is a diagram of an example of applying a uniaxial external magnetic field to magnetoresistive sensor 230. Although the functionality of magnetoresistive sensor 230 is described above with respect to a rotating external magnetic field vector, a uniaxial external magnetic field may induce a rotation of the magnetization of magnetoresistive sensor 230, in some implementations. In this case, domain walls may be created when the external magnetic field axis and the length axis of stripe portion 305 are not orthogonal.

As shown in FIG. 7, and by reference number 710, assume that a uniaxial magnetic field is applied to magnetoresistive sensor 230. As shown by reference number 720, further assume that an axis of the uniaxial magnetic field is not orthogonal (e.g. perpendicular) to the length axis of stripe portion 305. In this case, the uniaxial magnetic field may induce a rotation of magnetic moments of magnetoresistive sensor 230 in a similar manner as described elsewhere herein with respect to a rotating external magnetic field. In this way, magnetoresistive sensor 230 with stripe portion 305 and one or more extension portions 310 may improve the accuracy of electrical resistance measurements induced by a rotating external magnetic field, a uniaxial external magnetic field, or the like.

As indicated above, FIG. 7 is provided merely as an example. Other examples are possible and may differ from what was described above in connection with FIG. 7.

Implementations described herein include a magnetoresistive sensor with extension portions that create a less pronounced magnetic domain wall than a magnetoresistive sensor without the extension portions. As a result, the magnetoresistive sensor undergoes soft switching of magnetizations, resulting in less pronounced electrical discontinuities and better sensor performance.

The foregoing disclosure provides illustration and description, but is not intended to be exhaustive or to limit the implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items, and may be used interchangeably with "one or more." Where only one item is intended, the term "one" or similar language is used. Also, as used herein, the terms "has,"

"have," "having," or the like are intended to be open-ended terms. Further, the phrase "based on" is intended to mean "based, at least in part, on" unless explicitly stated otherwise.

What is claimed is:

1. A magnetoresistive sensor, comprising:
   a stripe portion comprising a first magnetoresistive material,
   the stripe portion of the magnetoresistive sensor having:
      a stripe width extending along a first axis from a first stripe edge of the stripe portion to a second stripe edge of the stripe portion,
      a length along a second axis that is substantially perpendicular to the first axis,
      a first end, and
      a second end,
         the first end and the second end being positioned at opposite ends of the stripe portion along the second axis; and
   an extension portion comprising a second magnetoresistive material,
      the extension portion being positioned at the first end of the stripe portion and contacting the stripe portion at the first end of the stripe portion,
      the extension portion having an extension width along the first axis and an extension length along the second axis,
      the extension width being larger than the stripe width such that the extension portion extends beyond the first stripe edge in a first direction along the first axis and extends beyond the second stripe edge in a second direction along the first axis, and
      the extension length being smaller than the extension width; a first contact component, the first contact component being positioned on the stripe portion nearer to the first end than to the second end; and a second contact component, the second contact component being positioned on the stripe portion nearer to the second end than to the first end.

2. The magnetoresistive sensor of claim 1, where the extension portion is a first extension portion; and
   the magnetoresistive sensor further comprising:
      a second extension portion comprising magnetoresistive material,
         the second extension portion of the magnetoresistive sensor being positioned at the second end of the stripe portion,
         the second extension portion having:
            the extension width along the first axis, or
            another extension width along the first axis,
               the other extension width being larger than the stripe width and being different from the extension width.

3. The magnetoresistive sensor of claim 1, where the first magnetoresistive material and the second magnetoresistive material are a same magnetoresistive material.

4. The magnetoresistive sensor of claim 1, where the first magnetoresistive material is different from the second magnetoresistive material; and
   where the first magnetoresistive material and the second magnetoresistive material are magnetically coupled.

5. The magnetoresistive sensor of claim 1, where the extension portion has a round, elliptical, rectangular, yoke, or arrowhead shape.

6. The magnetoresistive sensor of claim 1, where the magnetoresistive sensor is configured to measure magnetoresistance due to a change in resistance of the first magnetoresistive material or the second magnetoresistive material, in response to an external magnetic field, based on at least one of:
   an anisotropic magnetoresistance effect,
   a giant magnetoresistance effect, or
   a tunnel magnetoresistance effect.

7. A sensor module, comprising:
   a magnetoresistive sensor that includes:
      a stripe portion comprising magnetoresistive material,
         the stripe portion having:
            a stripe width, along a first axis, measured from a first stripe edge of the stripe portion to a second stripe edge of the stripe portion,
            a first end positioned on a second axis that is substantially perpendicular to the first axis,
            a second end positioned on the second axis, and
            a length measured from the first end to the second end,
               the length being larger than the stripe width; and
      an extension portion comprising magnetoresistive material,
         the extension portion being positioned at the first end of the stripe portion and contacting the stripe portion at the first end of the stripe portion,
         the extension portion having an extension width along the first axis and an extension length along the second axis,
         the extension width being larger than the stripe width and extending the extension portion beyond the first stripe edge in a first direction along the first axis and extending beyond the second stripe edge in a second direction along the first axis, and
         the extension length being smaller than the extension width; a first contact component, the first contact component being positioned on the stripe portion nearer to the first end than to the second end; and a second contact component, the second contact component being positioned on the stripe portion nearer to the second end than to the first end.

8. The sensor module of claim 7, where the extension portion is a first extension portion and the extension width is a first extension width; and
   where the magnetoresistive sensor further includes:
      a second extension portion comprising magnetoresistive material,
         the second extension portion being positioned at the second end of the stripe portion,
         the second extension portion having:
            a second extension width along the first axis.

9. The sensor module of claim 7, further comprising:
   a plurality of magnetoresistive sensors having stripe portions with stripe widths and extension portions with extensions widths that are larger than the stripe widths,
   the plurality of magnetoresistive sensors including the magnetoresistive sensor,
   at least one of the stripe widths matching the stripe width,
   at least one of the extension widths matching the extension width.

10. The sensor module of claim 7, further comprising:
    a Wheatstone bridge that includes the magnetoresistive sensor.

11. The sensor module of claim 7, where the magnetoresistive sensor is a first magnetoresistive sensor; and where the sensor module further comprises:
a second magnetoresistive sensor electrically coupled to the first magnetoresistive sensor.

12. An apparatus to measure magnetoresistance, the apparatus comprising:
a stripe portion of magnetoresistive material,
the stripe portion having:
a stripe width extending along a first axis from a first stripe edge of the stripe portion to a second stripe edge of the stripe portion,
a stripe length along a second axis that is substantially perpendicular to the first axis,
a first stripe end, and
a second stripe end,
the first stripe end and the second stripe end being positioned at opposite ends of the stripe portion along the second axis;
a first extension portion of magnetoresistive material,
the first extension portion being positioned at the first stripe end and contacting the stripe portion at the first stripe end,
the first extension portion having a first extension width, along the first axis, that is larger than the stripe width and that extends the first extension portion beyond the first stripe edge in a first direction along the first axis and beyond the second stripe edge in a second direction along the first axis, and
the first extension portion having a first extension length, along the second axis, that is smaller than the first extension width; and
a second extension portion of magnetoresistive material,
the second extension portion being positioned at the second stripe end and contacting the stripe portion at the second strip end,
the second extension portion having a second extension width, along the first axis, that is larger than the stripe width and that extends the second extension portion beyond the first stripe edge in the first direction along the first axis and beyond the second stripe edge in the second direction along the first axis, and
the second extension portion having a second extension length, along the second axis, that is smaller than the second extension width; a contact component, the contact component being positioned on the stripe portion nearer to the first stripe end than to the second stripe end, the contact component being positioned at a distance, from the first stripe end, that is greater than or equal to the first extension length.

13. The apparatus of claim 12, where the stripe portion has a non-uniform width along the first axis.

14. The apparatus of claim 12, where the first extension portion and the second extension portion are symmetrical.

15. The apparatus of claim 12, where the first extension portion and the second extension portion are asymmetrical.

16. The apparatus of claim 12, where the first extension portion has a round or elliptical shape.

17. The apparatus of claim 12, where the first extension portion has a rectangular shape.

* * * * *